United States Patent
Kim

(10) Patent No.: US 10,268,086 B2
(45) Date of Patent: Apr. 23, 2019

(54) ELECTRONIC DEVICE

(71) Applicant: LG Display Co., Ltd., Seoul (KR)

(72) Inventor: Kyoung-Hoon Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/839,570

(22) Filed: Dec. 12, 2017

(65) Prior Publication Data

US 2018/0164619 A1 Jun. 14, 2018

(30) Foreign Application Priority Data

Dec. 13, 2016 (KR) ........................ 10-2016-0169120

(51) Int. Cl.
| | | |
|---|---|---|
| G06F 1/16 | (2006.01) | |
| H05K 9/00 | (2006.01) | |
| G02F 1/1333 | (2006.01) | |
| G02F 1/1341 | (2006.01) | |

(52) U.S. Cl.
CPC ...... *G02F 1/1341* (2013.01); *G02F 1/133308* (2013.01); *G06F 1/16* (2013.01); *G06F 1/1601* (2013.01); *G06F 1/1637* (2013.01); *G02F 2001/133331* (2013.01); *G02F 2201/503* (2013.01); *H05K 9/0054* (2013.01)

(58) Field of Classification Search
CPC ............... G02F 1/1341; G02F 1/1333; G02F 1/133308; G02F 2001/133311; G02F 2001/133317; G06F 1/16; G06F 1/1601; G06F 1/1637; H05K 9/0054
See application file for complete search history.

(56) References Cited

U.S. PATENT DOCUMENTS

2015/0146112 A1* 5/2015 Gotou ............... G02F 1/133308
348/794
2017/0108721 A1* 4/2017 Bae ....................... G02B 6/0083

* cited by examiner

*Primary Examiner* — Nathanael R Briggs
(74) *Attorney, Agent, or Firm* — Polsinelli PC

(57) ABSTRACT

Disclosed is an electronic device in which a defect, where air bubbles occur in an OCR or a gap space is not filled in a D/B process, is prevented and a gap filling tape is adhered to a display module without a gap, thereby solving a problem where a crack or yellowing occurs in the display module. The electronic device includes a display panel including a first substrate and a second substrate bonded to a portion other than one edge of the first substrate, a panel supporting part supporting the display panel, a cover window attached on a front surface of the second substrate, a housing accommodating the panel supporting part and supporting the cover window, a gap between the one edge of the first substrate and the cover window, and a gap sealing member attached on a side surface of the panel supporting part to seal the gap.

20 Claims, 6 Drawing Sheets

ELECTRONIC DEVICE

CROSS-REFERENCE TO RELATED APPLICATION

This application claims the benefit of the Korean Patent Application No. 10-2016-0169120 filed on Dec. 13, 2016, which is hereby incorporated by reference in its entirety as if fully set forth herein.

BACKGROUND

Field of the Disclosure

The present disclosure relates to an electronic device.

Description of the Background

With the advancement of multimedia era, the importance of display devices is increasing. Therefore, liquid crystal display (LCD) devices and organic light emitting display devices having an active matrix type are being widely used. The LCD devices and the organic light emitting display devices are being used as a screen for portable electronic devices such as smartphones, electronic notebooks, e-books, portable multimedia players (PMPs), navigation devices, mobile phones, tablet personal computers (PCs), smartwatches, watch phones, wearable devices, and mobile communication terminals, televisions (TVs), notebook computers, monitors, cameras, camcorders, home appliances having a display screen, etc.

In a case where an electronic device displays a screen by using an LCD device, the electronic device includes a first substrate, an opposite substrate, and a liquid crystal layer provided between the first substrate and the opposite substrate. An alignment of liquid crystals of the liquid crystal layer is controlled by applying an electric field, thereby adjusting a transmittance of light.

Since LCD devices are driven with a low operating voltage, they consume low power and are used as portable devices. Accordingly, the LCD devices are widely applied to various fields such as notebook computers, monitors, spacecraft, airplanes, etc.

In the LCD devices, a liquid crystal display panel which displays an image includes a first substrate, an opposite substrate, and a liquid crystal layer provided between the first substrate and the opposite substrate. An alignment of liquid crystals of the liquid crystal layer is controlled by applying an electric field, thereby adjusting a transmittance of light.

The LCD devices have a mode where a pixel electrode is provided on the first substrate (or a thin film transistor (TFT) substrate), a common electrode is provided on the opposite substrate, and the alignment of the liquid crystals of the liquid crystal layer is controlled with a vertical electric field generated between the pixel electrode and the common electrode. Also, the LCD devices have another mode where both the pixel electrode and the common electrode are provided on the TFT substrate, and the alignment of the liquid crystals of the liquid crystal layer is controlled with a lateral electric field generated between the pixel electrode and the common electrode.

In LCD devices for controlling the alignment of the liquid crystals of the liquid crystal layer with the lateral electric field, a TFT, the pixel electrode, and the common electrode are provided on the first substrate whereas a light blocking layer and a color filter (CF) are provided on the opposite substrate. Manufacturing of the liquid crystal display panel is completed by forming the liquid crystal layer between the first substrate and the opposite substrate.

After the liquid crystal display panel is completed, a backlight unit which acts as a light source of an LCD device is provided. In order to maintain a thickness of the LCD device as thin as possible, the backlight unit may use an edge type backlight unit where the backlight unit is disposed on a side surface of the liquid crystal display panel. In the edge type backlight unit, a light guide plate (LGP) for causing light emitted from the backlight unit to travel to a liquid crystal cell is provided under the liquid crystal display panel.

Subsequently, the backlight unit is manufactured as a finished product through a module process. In the module process, a guide panel for supporting the backlight unit is coupled to a side surface. Then, a reflective sheet for reflecting light, traveling to a portion under the light guide plate, to an upper portion is provided, and a driving integrated circuit (IC) for driving the liquid crystal display panel is mounted on the first substrate extending to a non-display area instead of the color filter substrate.

The driving IC is disposed in only a partial area, instead of a whole area, of the first substrate extending to the non-display area. Therefore, a gap caused by the color filter substrate and an upper polarizer occurs in an area where the driving IC is not disposed. Due to the gap, when a physical force is applied from the outside, a crack can occur in a pad part corresponding to a region, where the driving IC is provided, of the non-display area of the liquid crystal display panel.

In the related art LCD device, in order to prevent a crack from occurring in the pad part, a gap filling tape is disposed in an area where the driving IC is not disposed. Subsequently, an adhesive (for example, an optical clear resin (OCR) or an optical clear adhesive (OCA)) is coated on the gap filling tape, and a cover window is bonded to the gap filling tape. However, due to the reason of design, a gap is formed between a rear surface of the cover window and the gap filling tape.

In more detail, a gap of a minimum of 50 μm is formed for preventing a defect from air bubbles generated in the OCR or a gap is not filled in a D/B process included in a module process. If the gap is formed, a crack or yellowing occurs in a display module. Also, an application processor (AP) is adhered to a pad part by an adhesive including an acryl-based material, and for this reason, the pad part can be corroded under an environment reliability condition.

SUMMARY

Accordingly, the present disclosure is directed to provide an electronic device that substantially obviates one or more problems due to limitations and disadvantages of the related art.

An aspect of the present disclosure is directed to provide an electronic device in which a defect, where air bubbles occur in an OCR or a gap space is not filled in a D/B process, is prevented and a gap filling tape is adhered to a display module without a gap, thereby solving a problem where a crack or yellowing occurs in the display module.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electronic device including a display panel including a first substrate and a second substrate bonded to a portion other than one edge of the first substrate, a panel supporting part supporting the display panel, a cover window attached on a front surface of the second substrate, a housing accommodating the panel supporting part and supporting the cover window, a gap between the one edge of the first substrate and the cover window, and a gap sealing member attached on a side surface of the panel supporting part to seal the gap.

In another aspect of the present disclosure, an electronic device comprises a display panel having first and second substrates bonded to each other, the first substrate having an edge portion not bonded to the second substrate; a panel supporting part supporting the display panel; a housing accommodating the panel supporting part including the display panel; and a gap sealing member including a base member attached to a side surface of the panel supporting part through an adhesive surface on the base member and sealing a gap between the display panel and the housing.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
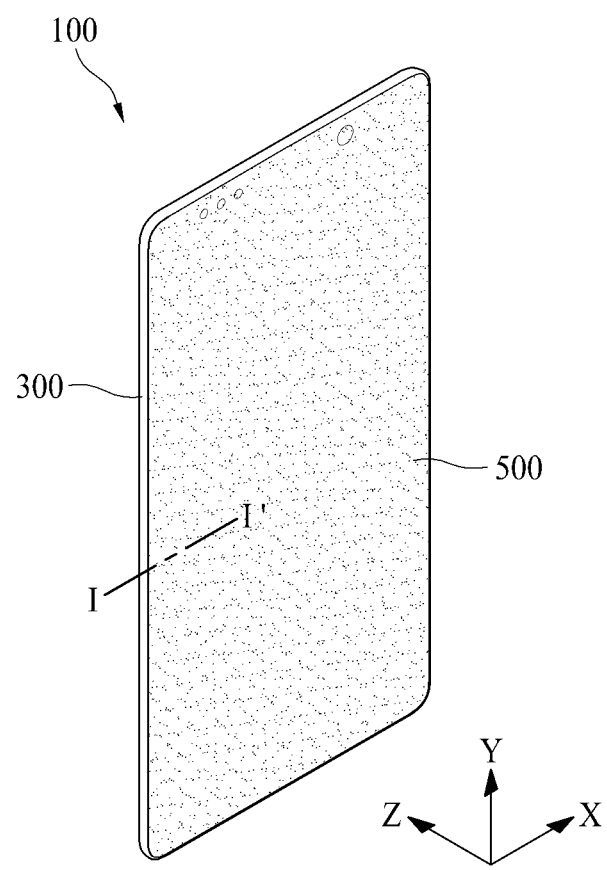
FIG. 1 is a perspective view illustrating an electronic device according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after', 'subsequent', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is strictly vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of a display device and an electronic device including the same according to the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
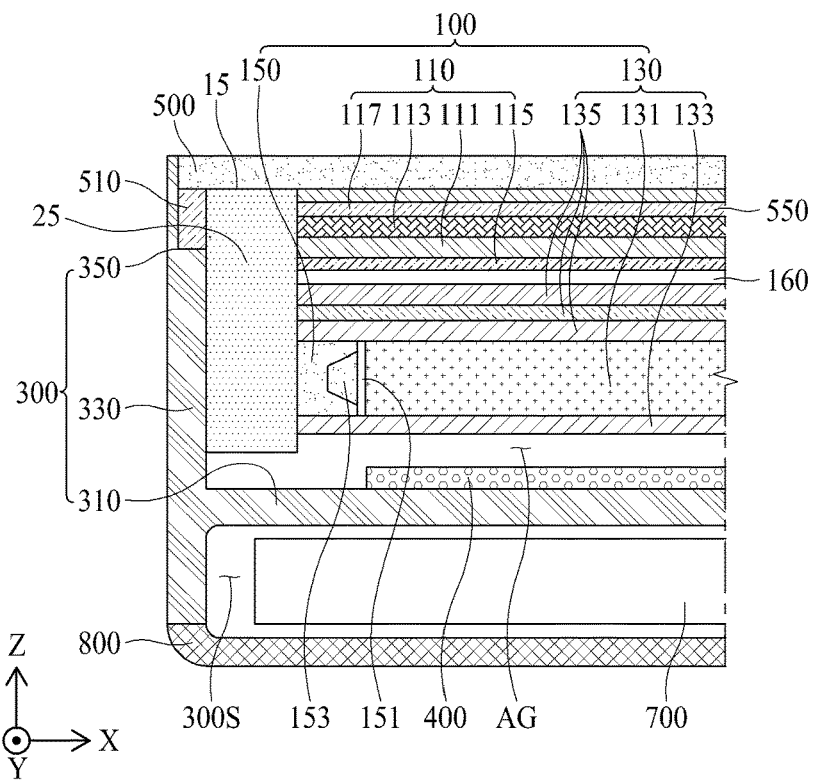
FIG. 2 is a cross-sectional view taken along line I-I' in FIG. 1.

FIG. 1 is a perspective view illustrating an electronic device according to an aspect of the present disclosure, and FIG. 2 is a cross-sectional view taken along line I-I' in FIG. 1.

Referring to FIGS. 1 and 2, the electronic device according to an aspect may include a display module 100, a housing 300, and a cover window 500.

The display module 100 may be defined as a display device that displays an image. The display module 100 according to an aspect may include a display panel 110, a backlight unit 130, and an auxiliary light source 150.

The display panel 110 may be a liquid crystal display panel which displays an image by driving liquid crystal molecules, and may include a first substrate 111 and a second substrate 113 which are bonded to each other with a liquid crystal layer therebetween. The display panel 110 may display an image by using light irradiated from the backlight unit 130.

The first substrate 111 may be a thin film transistor (TFT) array substrate and may include a plurality of subpixels respectively provided in a plurality of pixel areas defined by intersections of a plurality of gate lines and a plurality of data lines. Each of the plurality of subpixels may include a TFT connected to a gate line and a data line, a pixel electrode connected to the TFT, and a common electrode which is provided to vertically overlap the pixel electrode. Here, the pixel electrode may be provided in a pixel area, and the common electrode may be provided in a plurality of adjacent pixel areas. The TFT may include an amorphous silicon semiconductor layer.

A pad part connected to each of a plurality of signal lines may be provided in a lower edge of the first substrate 111 and may be connected to a driving circuit. Also, a built-in gate driving circuit for driving the gate lines of the display panel 110 may be provided in a left edge and/or a right edge non-display area of the first substrate 111. The built-in gate driving circuit may be connected to the gate lines and may be provided in a non-display area of the first substrate 111 simultaneously with a process of manufacturing the TFT of each pixel. The built-in gate driving circuit may generate a sequentially shifted gate signal having a gate-on voltage and may supply the gate signal to a corresponding gate line according to a gate control signal supplied from the driving circuit.

The second substrate 113 may include a pixel defining pattern, which defines an opening area overlapping each pixel area provided in the first substrate 111, and a color filter which is provided in the opening area. The second substrate 113 may be opposite-bonded to the first substrate 111 by a sealant with the liquid crystal layer therebetween and may cover the other whole portion of the first substrate 111 except for the pad part of the first substrate 111.

A lower polarizing member 115 having a first polarization axis may be attached on a rear surface of the first substrate 111, and an upper polarizing member 117 having a second polarization axis intersecting the first polarization axis may be attached on a front surface of the second substrate 113.

A common electrode provided on the first substrate 111 of the display panel 110 may be used as a liquid crystal driving electrode along with a pixel electrode in a display mode.

The backlight unit 130 may be disposed under the display panel 110 and may irradiate light onto the display panel 110.

The backlight unit 130 may include a light guide plate 131, a light source unit (not shown), a reflective sheet 133, and an optical sheet part 135.

The light guide plate 131 may include a light incident part which is at least provided on one side. The light guide plate 131 may guide light, which is incident through the light incident part, in a direction toward a top (i.e., toward the display panel 110).

The light source unit may be disposed to face the light incident part of the light guide plate 131 and may irradiate light onto the light incident part of the light guide plate 131. The light source unit may include a printed circuit board (PCB) disposed adjacent to the light incident part of the light guide plate 131 and a plurality of light emitting diode (LED) packages mounted on the PCB.

The reflective sheet 133 may cover a rear surface of the light guide plate 131. The reflective sheet 133 may reflect light, which is incident through a lower surface of the light guide plate 131, toward the inside of the light guide plate 131, thereby minimizing the loss of the light.

The optical sheet part 135 may be disposed on the light guide plate 131 to enhance a luminance characteristic of light irradiated from the light guide plate 131. For example, the optical sheet part 135 may include a diffusive sheet, a prism sheet, and a dual brightness enhancement film, but is not limited thereto. In other aspects, the optical sheet part 135 may include a stacked combination of two or more elements selected from among a diffusive sheet, a prism sheet, a dual brightness enhancement film, and a lenticular sheet.

The auxiliary light source 150 may be provided in a tetragonal belt shape and may be attached on a rear edge of the display panel 110. When a light source of the backlight unit 130 is insufficient, the auxiliary light source 150 may be optionally used for increasing luminance. Also, the auxiliary light source 150 may be surrounded by a stiff case material, and thus, may support the display panel 110. The auxiliary light source 150 may surround each of side surfaces of the backlight unit 130 to minimize a movement of the backlight unit 130. The auxiliary light source 150 may include a sheet supporting part 151 and a panel supporting part 153.

The sheet supporting part 151 may be provided in a tetragonal belt shape to overlap the backlight unit 130, namely, an edge of the optical sheet part 135 and may support the edge of the optical sheet part 135. A lower surface of the sheet supporting part 151 may be attached on an extension area of the reflective sheet 133 by a frame adhesive member like a double-sided tape.

The panel supporting part 153 may protrude from an upper edge of the sheet supporting part 151 in a tetragonal belt shape and may be attached on a rear edge of the display panel 110 by a panel adhesive member 160. Here, the panel adhesive member 160 may include a double-sided tape, a thermo-curable resin, a photo-curable resin, a double-sided adhesive foam pad, or the like.

The auxiliary light source 150 may be attached on the display panel 110 to support the backlight unit 130, and thus, the backlight unit 130 may be hanged on a rear surface of the display panel 110.

The housing 300 may accommodate the display module 100 and may support the cover window 500. That is, the housing 300 may directly surround side surfaces and a rear surface of the display module 100.

The housing 300 may include an accommodating space which is defined by a housing plate 310 and a housing side wall 330. The housing 300 may have a box shape with an upper surface opened. The housing 300 may be formed of a conductive material, a metal material, and/or the like. Here, the housing 300 may be formed of aluminum (Al), invar, magnesium (Mg), and/or the like.

The housing plate 310 may be a floor of the accommodating space and may cover the rear surface of the display module 100.

At least one system accommodating space 300S may be provided in a rear surface of the housing plate 310. A battery 700 for supplying a driving power, a communication module (not shown), a power circuit (not shown), a memory (not shown), the driving circuit, a voltage generation circuit, and/or the like may be accommodated into the system accommodating space 300S. The system accommodating space 300S may be covered by a rear cover 800.

The housing side wall 330 may be provided vertical to each of side surfaces of the housing plate 310. The housing side wall 330 may support the cover window 500 and may directly surround each of side surfaces of the display module 100.

The cover window 500 may be supported by the housing 300 to cover a whole portion of the display panel 110. The cove window 500 may be formed of tempered glass, transparent plastic, a transparent film, or the like, but is not limited thereto. In other aspects, the cover window 500 may be formed of tempered glass, based on scratch and transparency.

The cover window 500 may be supported by an elastic member 510 provided on the housing side wall 330.

The elastic member 510 may be attached on a groove 350 provided in an upper inner wall of the housing side wall 330 to support a rear edge of the cover window 500. The elastic member 510 may include an elastic pad having an elastic restoring force, a double-sided adhesive foam pad, or a spring. The elastic member 510 may decrease an impact applied to the cover window 500.

The cover window 500 may be coupled to the elastic member 510 which is disposed in the groove 350 of the housing side wall 330, thereby protecting the display module 100 from an external impact and preventing particles from penetrating through a space between the display module 100 and the housing side wall 330.

The cover window 500 may be attached on the display module 100 (i.e., a front surface of the display panel 110) by a transparent adhesive member 550 to support the display module 100 and protect the display panel 110 from an external impact. The transparent adhesive member 550 may include an optical clear adhesive (OCA) or an optical clear resin (OCR).

As the display panel 110 is attached on the cover window 500, the display module 100 may be spaced apart from the housing plate 310 of the housing 300 by a certain distance. An air gap AG may be provided between a rear surface of the display module 100 and the housing plate 310. The air gap AG prevents the display module 100 from being damaged when the display module 100 contacts the housing plate 310 due to pressure applied to the cover window 500. Also, the electronic device may further include a buffering pad 400 attached on the housing plate 310.

The buffering pad 400 may be attached on the housing plate 310 to directly face the rear surface of the display module 100. When the display module 100 is deformed, the buffering pad 400 prevents the display module 100 from being damaged due to a physical contact between the display module 100 and the housing plate 310. To this end, the buffering pad 400 may include a soft material, for example, polyurethane (PU).

A gap may be provided between one edge of the first substrate 111 and the cover window 500. This is because there is a difference between a size of the first substrate 111 and a size of the second substrate 113. When a physical force is applied from the outside, due to a gap caused by a space between the first substrate 110 and the cover window 500, a crack can easily occur in a pad part which is a region, where the driving IC is provided, of the non-display area of the display panel 100.

In an aspect of the present disclosure, the electronic device may include a plurality of gap sealing members 15 and 25 which are attached on a side surface of the panel supporting part 153 to seal a gap. The plurality of gap sealing members 15 and 25 may include a front gap sealing member 15 and a side gap sealing member 25. The front gap sealing member 15 and the side gap sealing member 25 may be successively disposed. The side gap sealing member 25 may extend from the front gap sealing member 15 and may be attached on a side surface of the panel supporting part 153. The side gap sealing member 25 may surround the panel supporting part 153, and the side gap sealing member 25 may be folded in an air gap AG under the reflective sheet 133 under the panel supporting part 153 and may be attached on the reflective sheet 133.

When the gap sealing members 15 and 25 are attached on the side surface of the panel supporting part 153 to seal a gap, the first substrate 111 or the cover window 500 may be stably fixed so as not to be moved by a gap between the first substrate 111 and the cover window 500. Also, all of the gaps are fully filled by the gap sealing members 15 and 25, and thus, a separate filler based on a shape of a space may not be used. Also, the front gap sealing member 15 may be fixed by the side gap sealing member 25 without moving, and thus, a separate adhesive may not be added.

Figure 3:
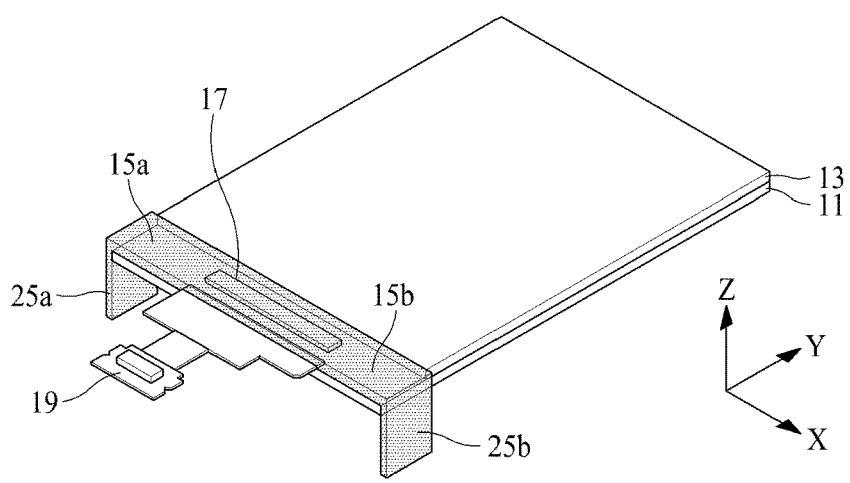
FIG. 3 is a perspective view illustrating a first substrate, a second substrate, a driving integrated circuit (IC), a flexible printed circuit board (FPCB), and a gap sealing member according to an aspect of the present disclosure.

FIG. 3 is a perspective view illustrating a first substrate 11, a second substrate 13, a driving integrated circuit (D-IC) 17, a flexible printed circuit board (FPCB) 19, and a plurality of gap sealing members 15 and 25 according to an aspect of the present disclosure.

The display panel 110 may selectively transmit the light supplied from the backlight unit to display an image. The driving IC 17 and the FPCB 19 may be installed on one side of the display panel 110.

The display panel 110 may include the first substrate 11 on which a plurality of TFTs are provided, the second substrate 13 disposed on and boned to the first substrate 11, and a liquid crystal injected between the first substrate 11 and the second substrate 13. The first substrate 11 and the second substrate 13 may be twistedly disposed, and thus, a portion of the first substrate 11 may be exposed. The driving IC 17 may be mounted on an edge of the exposed portion of the first substrate 11 to control the display panel 110.

The first substrate 11 may be a transparent glass substrate on which the TFTs are arranged in a matrix type, and may include a source terminal connected to a data line and a gate terminal connected to a gate line. The data line and the gate line may be connected to the driving IC 17.

The FPCB 19 may be connected to one side of the driving IC 17. When an electrical signal is applied from the FPCB 19, the electrical signal may be applied to a plurality of data lines and a plurality of gate lines through the driving IC 17, and thus, a TFT provided in each of a plurality of pixels may be turned on or off to apply or cut off a driving voltage to a corresponding pixel.

The first substrate 11 may be disposed on and bonded to the second substrate 13. The second substrate 13 may be a substrate where red (R), green (G), and blue (B) pixels (RGB pixels), which are color pixels realizing colors with light passing through the color filters, are provided through a thin film process. A polarizer may be attached on a surface of each of the first substrate 11 and the second substrate 13 to polarize the light.

In an aspect of the present disclosure, the electronic device may further include the driving IC 17 mounted on one edge of the first substrate 11, and a gap may be provided between the cover window 500 and an area where the driving IC 17 is not provided, of the one edge of the first substrate 11. The gap may be formed based on a size difference between the first substrate 11 and the second substrate 13, and moreover, the area where the driving IC 17 is mounted may become like a filled space instead of a gap, based on a height of the driving IC 17. In this case, the gap is not fully filled with a related art sealing member, but may be fully filled with the gap sealing members 15 and 25 according to an aspect of the present disclosure.

A plurality of front gap sealing members 15a and 15b may be disposed on one edge surface of the first substrate 11 except for the area where the driving IC 17 is provided. Alternatively, the front gap sealing members 15a and 15b may be disposed to have a thin thickness equal to a height of the driving IC 17 in the area where the driving IC 17 is provided.

A plurality of side gap sealing members 25a and 25b may respectively extend from the front gap sealing members 15a and 15b. The side gap sealing members 25a and 25b may be disposed successive to the front gap sealing members 15a and 15b.

Figure 4:
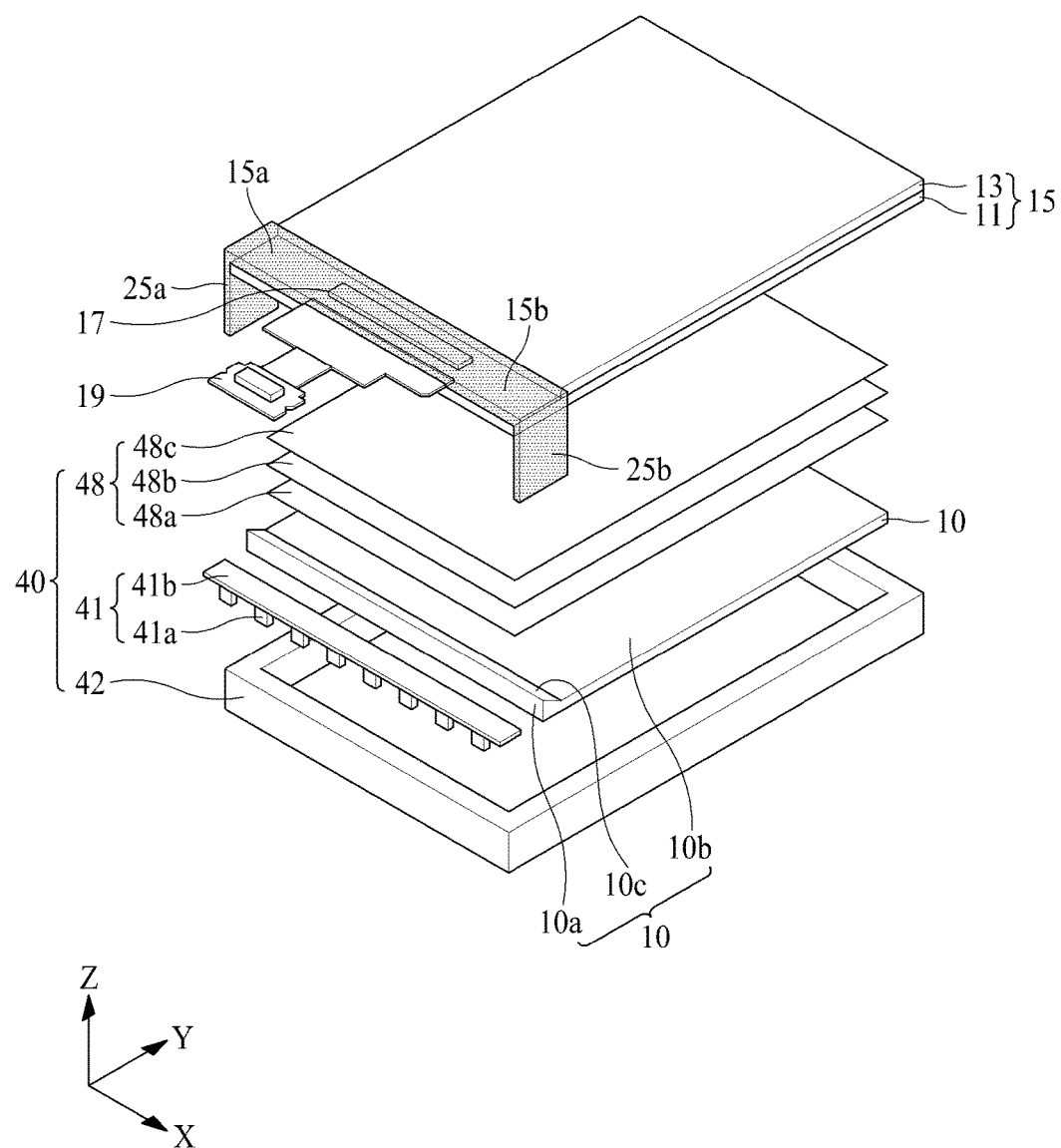
FIG. 4 is a schematic exploded perspective view of an electronic device according to an aspect of the present disclosure.
Figure 5:
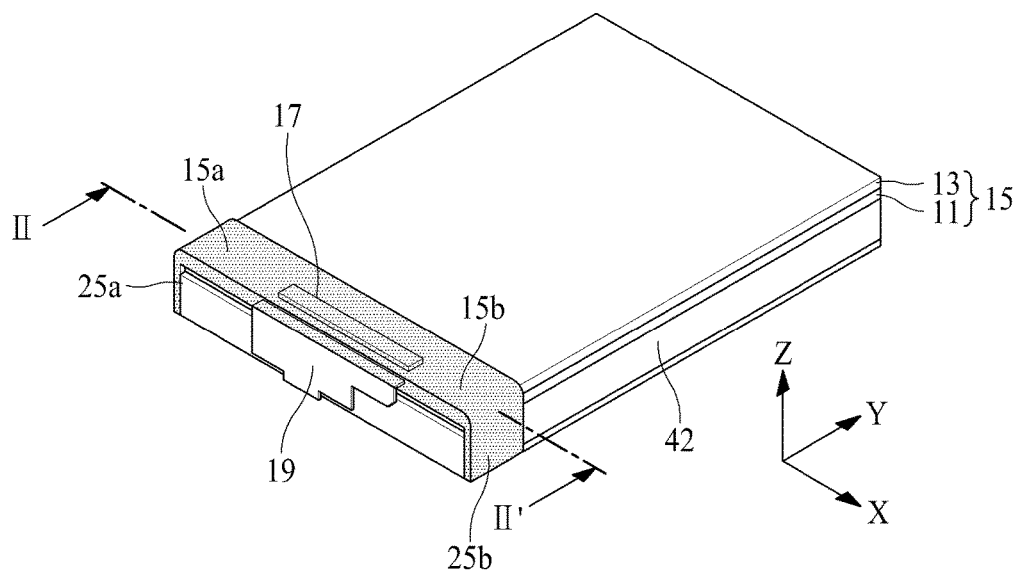
FIG. 5 is a schematic perspective view of an electronic device according to an aspect of the present disclosure.

FIG. 4 is a schematic exploded perspective view of an electronic device according to an aspect of the present disclosure. FIG. 5 is a schematic perspective view of the electronic device according to an aspect of the present disclosure.

The electronic device may include a light source 41 which supplies light to the electronic device, a light guide plate 10 which guides light emitted from the light source 41 to supply the light to an optical sheet 48, and the optical sheet 48 which converts the light, supplied from the light source 41, into uniform flat light to supply the uniform flat light to the display panel 110.

The light source 41 may be disposed as an edge type to face a light incident surface 10a of the light guide plate 10. The light source 41 may include a light emitting diode 41a and a flexible board 41b with the light emitting diode 41a mounted thereon. The flexible board 41b is bendable. A circuit may be built into the flexible board 41b to turn on or off the light emitting diode 41a. The light emitting diode 41a may be disposed as a side view type on the flexible board 41b, and the light emitting diode 41a may be disposed thereunder to face the light incident surface 10a of the light guide plate 10. The light emitting diode 41a may be disposed to face the light incident surface 10a of the light guide plate 10, and an FPCB 41b may be disposed thereon and folded or unfolded.

The light guide plate 10 may be disposed in order for the light incident surface 10a to face the light source 41. The light guide plate 10 may be supplied with the light, emitted from the light source 41, through the light incident surface 10a. The light incident through the light incident surface 10a may travel inside the light guide plate 10 and then may be transferred to an upper portion through a pattern provided on the upper portion. The light transferred to the upper portion may be supplied to the optical sheet 48 disposed on the light guide plate 10.

The light guide plate 10 may include the light incident surface 10a which receives the light from the light emitting diode 41a, a light output surface 10b which faces the display panel 110 and transfers the light, and an inclined surface 10c which connects the light incident surface 10a to the light output surface 10b. The inclined surface 10c may have a height which is progressively lowered in a direction from the light incident surface 10a to the light output surface 10b, and a height of the light output surface 10b may be constant. The optical sheet 48 may be disposed on the light output surface 10b at the same height as the lowered height of the light guide plate 10. Therefore, a thickness of an LCD device may be reduced to decrease weight, and moreover, the electronic device may be slimly modularized. The light guide plate 10 may be high in stiffness, and thus, is not easily modified or broken. The light guide plate 10 may be formed of polymethyl methacrylate (PMMA) which is good in transmittance.

The optical sheet 48 may be disposed on the light output surface 10b of the light guide plate 10. The optical sheet 48 may diffuse and condense the light incident from the light guide plate 10 and may include a diffusive sheet 48a, a prism sheet 48b, and a protective sheet 48c. The diffusive sheet 48a may include a base plate and a bead-shaped coating layer provided on the base plate. The diffusive sheet 48a may diffuse the light irradiated from the light source 41 to supply the diffused light to the first substrate 11. The prism sheet 48b may include prisms which have a triangular pillar shape and are arranged on an upper surface of the prism sheet 48b. The light diffused by the diffusive sheet 48a may be condensed in a direction vertical to a plane of the display panel 110. The protective sheet 48c may protect the prism sheet 48b vulnerable to a scratch.

A panel supporting part 42 may surround and fix a border of each of the light guide plate 10 and the optical sheet 48, and moreover, may support the electronic device disposed thereon. The panel supporting part 42 may be formed of a metal material or a plastic material such as polycarbonate (PC) or the like.

The front gap sealing members 15a and 15b, as described above, may be provided in an area other than an area, where the driving IC 17 is provided, of the one edge of the first substrate 11, or may be provided to have a thin thickness equal to a height of the driving IC 17 in the area where the driving IC 17 is provided. The side gap sealing members 25a and 25b may be attached on a side surface of each of the first substrate 11, the second substrate 13, and the panel supporting part 42. The side gap sealing members 25a and 25b may be folded in a direction toward a lower portion of the panel supporting part 42 and may be attached on a lower surface of the panel supporting part 42.

Figure 6:
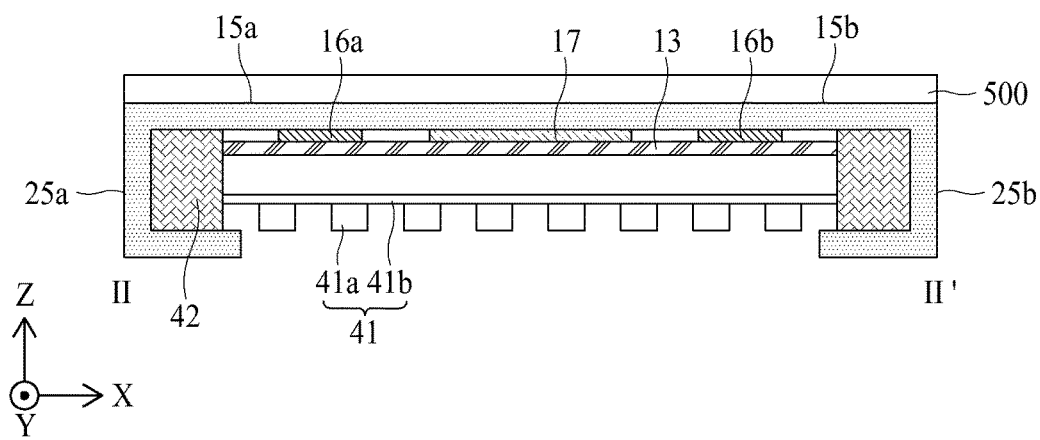
FIG. 6 is a cross-sectional view taken along line II-II' of FIG. 5.
Figure 7:
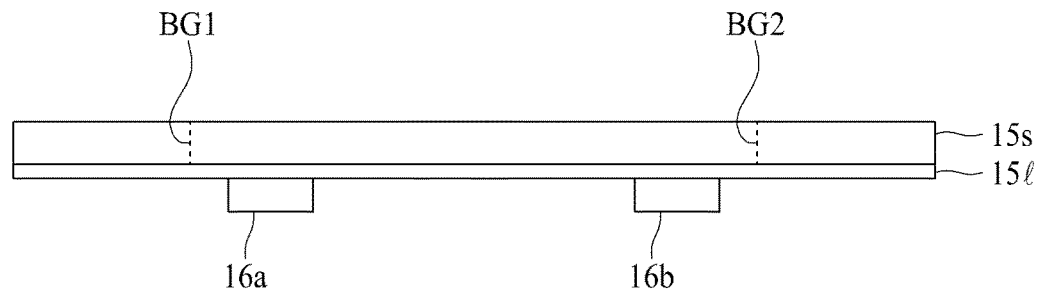
FIG. 7 is a cross-sectional view illustrating a gap sealing member of FIG. 6.

FIG. 6 is a cross-sectional view taken along line II-II' of FIG. 5. FIG. 7 is a cross-sectional view illustrating in detail gap sealing members 15 and 25 of FIG. 6.

The gap sealing members 15 and 25 according to an aspect of the present disclosure may each include a base member 15s, including an adhesive surface 151, and a plurality of sealing pads 16a and 16b attached on the adhesive surface 151 of the base member 15s and overlapping a gap.

Both edges of the base member 15s may extend to surround a side surface of the panel supporting part 42. Therefore, the both edges of the base member 15s may be the side gap sealing members 25a and 25b. In a case where the both edges of the base member 15s are used as the side gap sealing members 25a and 25b, the side gap sealing members 25a and 25b disposed successive to a plurality of front gap sealing members 15a and 15b may be provided by using the base member 15s which is a single base member.

The base member 15s may be implemented with a single tape. The single tape may be provided on only surfaces on which the adhesive surface 151 contacts the sealing pads 16a and 16b, the driving IC 17, and the panel supporting part 42. The adhesive surface 151 may not be provided on a surface contacting the cover window 500. Accordingly, a friction with the cover window 500 does not occur, thereby preventing the cover window 500 from being damaged.

The sealing pads 16a and 16b may be disposed in an area other than an area, where the driving IC 17 is provided, of a lower surface of the adhesive surface 151. The sealing pads 16a and 16b may compensate for a gap caused by the driving IC 17. A height of each of the sealing pads 16a and 16b may be equal to that of the driving IC 17. The sealing pads 16a and 16b may each be formed of polyethylene terephthalate (PET), but are not limited thereto. In other aspects, the sealing pads 16a and 16b may each be formed of a material such as plastic having flexibility.

In other aspects, the base member 15s according to an aspect of the present disclosure may include a plurality of front portions 15a and 15b overlapping one edge of the first substrate 11, a first extension portion 25a which extends from one end of a front portion 15a and surrounds one side surface of the panel supporting part 42, and a second extension portion 25b which extends from the other end of the front portion 15b and surrounds the other side surface of the panel supporting part 42.

Therefore, the base member 15s according to an aspect of the present disclosure may successively overlap one edge of the first substrate 11 and may surround both side surfaces of the panel supporting part 42. Accordingly, the base member 15s according to an aspect of the present disclosure may be stably attached on the panel supporting part 42.

Moreover, the base member 15s according to an aspect of the present disclosure may include a first bending guider BG1, provided between the front portion 15a and the first extension portion 25a, and a second bending guider BG2 provided between the front portion 15b and the second extension portion 25b.

The first and second bending guiders BG1 and BG2 enable the base member 15s to be bent. The first and second bending guiders BG1 and BG2 enable the base member 15s to be bent without being cut. The first and second bending guiders BG1 and BG2 enable the front portions 15a and 15b, the first extension portion 25a, and the second extension portion 25b to be successively formed by using the base member 15s.

The first and second bending guiders BG1 and BG2 may each be a groove line which is provided in the base member 15s. For example, the groove line may be formed in the base member 15s through a half-cutting process. The groove line may be a bending line which divides the front portions 15a and 15b, the first extension portion 25a, and the second extension portion 25b without separating the base member 15s from the panel supporting part 42. Also, the groove line prevents the base member 15s from being separated from the panel supporting part 42 in a boundary area between one side of the front portion 15a and the first extension portion 25a or in a boundary area between the other side of the front portion 15b and the second extension portion 25b.

FIGS. 8 to 11 are plan views illustrating a sealing pad 16 according to an aspect of the present disclosure.

Figure 8:
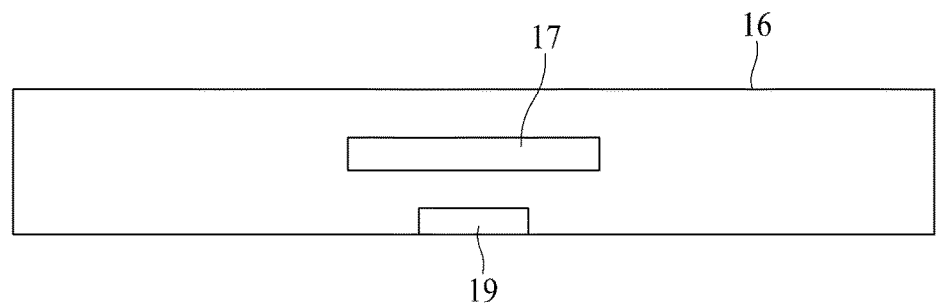
FIGS. 8 to 11 are plan views illustrating a sealing pad according to an aspect of the present disclosure.

As in FIG. 8, the sealing part 16 may have a frame shape including an opening which overlaps the driving IC 17. That is, the sealing pad 16 may be disposed in an area other than an area, where the driving IC 17 and the FPCB 19 are provided, of one edge area of the first substrate 11.

The sealing pad 16 may be provided to have the same height as that of the driving IC 17 and may compensate for a gap caused by the driving IC 17. Accordingly, when the sealing pad 16 has a frame shape, the sealing pad 16 properly functions to compensate for a gap. Also, the driving IC 17 may support the sealing pad 16, and thus, the sealing pad 16 may be stably fixed without moving.

Figure 9:
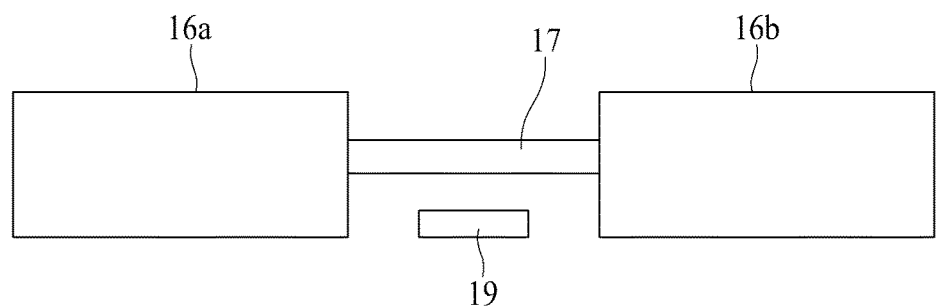

As another example, as in FIG. 9, a pair of sealing pads 16a and 16b may be disposed in a gap. The pair of sealing pads 16a and 16b may be arranged in parallel with the driving IC 17 therebetween. Particularly, the pair of sealing pads 16a and 16b may be arranged in a lateral direction of the electronic device with the driving IC 17 therebetween.

An area occupied by an upper area or a lower area of the driving IC 17 is small in comparison with a left area or a right area of the driving IC 17, and thus, even when the sealing pads 16a and 16b are not provided in the upper area or the lower area, a risk where a crack occurs dues to the occurrence of a gap is low. Also, the pair of sealing pads 16a and 16b may be easily provided on the left and the right of the driving IC 17 through a process, and thus, a risk where an error occurs is low.

Figure 10:
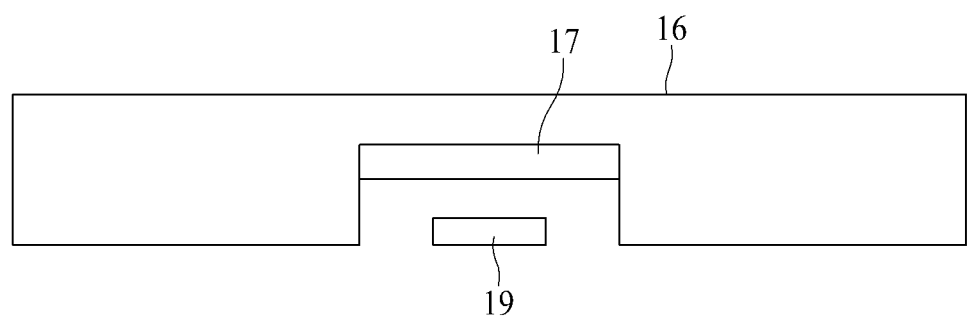
Figure 11:
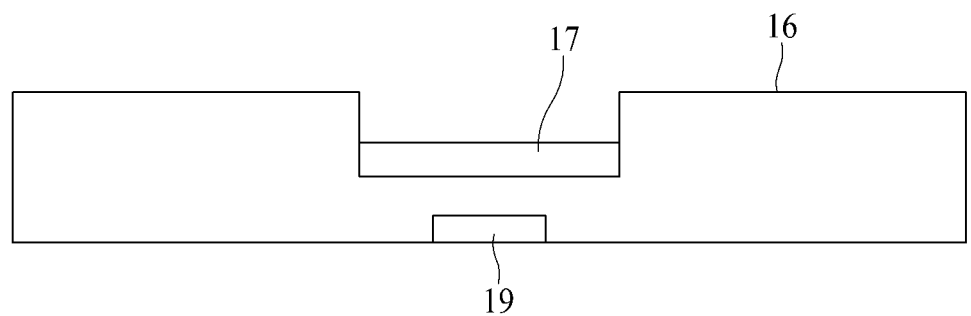

As another example, as in FIGS. 10 and 11, the display panel 110 may further include a pad part provided in one edge of the first substrate 11. The sealing pad 16 may be disposed in an area other than an area, where the driving IC 17 and the pad part are provided, of the one edge of the first substrate 11.

The pad part may be an area where a plurality of conductive pads, which are terminals for electrically connecting the first substrate 11 to other circuits of the electronic device, are provided. The pad part may be disposed in an upper area of the driving IC 17, or may be disposed between the driving IC 17 and the FPCB 19. The pad part may be formed of a material, which has high electrical conductivity, for well performing an electrical connection.

The sealing pad 16 may be formed of an insulating material such as PET, general plastic, or the like. Therefore, when the sealing pad 16 is disposed in an area other than the area where the pad part is provided, the sealing pad 16 may cover the pad part, thereby solving a problem where the number of electrical terminals available to the first substrate 11 is reduced.

In the electronic device according to the aspects of the present disclosure, since the gap sealing member is assembled after the D/B process, a problem where a gap is not filled is solved, and a defect where air bubbles occur in an adhesive (for example, an OCR) is prevented.

Moreover, in the electronic device according to the aspects of the present disclosure, since the gap sealing member is fitted into and assembled with the sealing pad, a gap between the rear surface of the cover window and the gap sealing member does not exist. Accordingly, a crack or yellowing does not occur, and the quality of the display module is improved.

Moreover, in the electronic device according to the aspects of the present disclosure, by removing a double-sided tape, corrosion is prevented from occurring between an AP and the pad part.

Moreover, in the electronic device according to the aspects of the present disclosure, an upper layer which is separately used in the gap sealing member is removed. Accordingly, the manufacturing cost is reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electronic device comprising:
    a display panel including a first substrate and a second substrate bonded to each other except for a portion of an edge of the first substrate;
    a panel supporting part supporting the display panel;
    a cover window attached on the second substrate;
    a housing accommodating the panel supporting part and supporting the cover window;
    a gap between the edge of the first substrate and the cover window; and
    a gap sealing member including a front side gap sealing part and a lateral side gap sealing part vertically extended from the front gap sealing part, wherein the front side gap sealing part faces the cover window and the lateral side gap sealing part is attached on a side surface of the panel supporting part to seal the gap.

2. The electronic device of claim 1, further comprising a driving integrated circuit on the edge of the first substrate, wherein the gap is disposed between the cover window and an area of the edge of the first substrate where the driving integrated circuit is not located.

3. The electronic device of claim 2, wherein the front side gap sealing part of the gap sealing member
    includes an adhesive surface attached with a sealing pad and overlapping the gap, wherein both edges of the lateral side gap sealing part surround the side surface of the panel supporting part.

4. The electronic device of claim 3, wherein the adhesive surface is a single sided tape.

5. The electronic device of claim 3, wherein
    the front side gap sealing part overlaps the edge of the first substrate and the lateral side gap sealing part has first and second extension portions,
    wherein the first extension portion is extended from one end of the front side gap sealing part to surround one side surface of the panel supporting part, and
    the second extension portion from another end of the front portion to surround another side surface of the panel supporting part.

6. The electronic device of claim 5, wherein the the front side gap sealing part and the lateral side gap sealing part are separated by a first bending guider between the front portion and the first extension portion and a second bending guider between the front portion and the second extension portion.

7. The electronic device of claim 6, wherein each of the first and second bending guiders includes a groove line between the front portion and the first extension portion and the front portion and the second extension portion, respectively.

8. The electronic device of claim 3, wherein the sealing pad includes an opening vertically overlapping the driving integrated circuit.

9. The electronic device of claim 2, further comprising a pair of sealing pads in parallel attached on an adhesive surface of the front side gap sealing part and overlapping the gap, wherein the driving integrated circuit is disposed between the pair of sealing pads.

10. The electronic device of claim 3, further comprising a pad part at the edge of the first substrate, and the sealing pad is disposed at the portion of the edge of the first substrate where the driving integrated circuit and the pad part are not located.

11. An electronic device comprising:
    a display panel having first and second substrates bonded to each other, the first substrate having an edge portion not bonded to the second substrate;
    a panel supporting part supporting the display panel;
    a housing accommodating the panel supporting part including the display panel; and
    a gap sealing member including a front side gap sealing part and a lateral side gap sealing part vertically extended from the front gap sealing part, wherein the front gap sealing part faces an opposite direction to the display panel and the side gap sealing part is attached to a side surface of the panel supporting part to seal a gap between the display panel and the housing.

12. The electronic device of claim 11, further comprising a sealing pad attached to an adhesive surface of the the front side gap sealing part.

13. The electronic device of claim 11, wherein the lateral side gap sealing part surrounds a bottom surface of the panel supporting part in addition to the side surface of the panel supporting part.

14. The electronic device of claim 11, further comprising a driving integrated circuit in close proximity to the edge portion of the first substrate.

15. The electronic device of claim 12, wherein the adhesive surface includes a single sided tape.

16. The electronic device of claim 11, wherein
    the front side gap sealing part overlaps the edge of the first substrate and the lateral side gap sealing part has first and second extension portions,
    wherein the first extension portion is extended from one end of the front side gap sealing part to surround one side surface of the panel supporting part, and
    the second extension portion from another end of the front portion to surround another side surface of the panel supporting part.

17. The electronic device of claim 16, wherein the the front side gap sealing part and the lateral side gap sealing part are separated by a first bending guider between the front portion and the first extension portion and a second bending guider between the front portion and the second extension portion.

18. The electronic device of claim 17, wherein each of the first and second bending guiders includes a groove line between the front portion and the first extension portion and the front portion and the second extension portion, respectively.

19. The electronic device of claim 14, further comprising a pair of sealing pads in parallel attached on an adhesive surface of the base member the front side gap sealing part, wherein the driving integrated circuit is disposed between the pair of sealing pads.

20. The electronic device of claim 12, further comprising a pad part at the edge portion of the first substrate, and the sealing pad is disposed at the edge portion of the first substrate where the driving integrated circuit and the pad part are not located.

* * * * *